(12) United States Patent
Sekine

(10) Patent No.: US 9,515,044 B1
(45) Date of Patent: Dec. 6, 2016

(54) ELECTRONIC DEVICE, METHOD OF MANUFACTURING THE SAME, METAL PARTICLE, AND ELECTROCONDUCTIVE PASTE

(71) Applicant: NAPRA CO., LTD., Katsushika-ku, Tokyo (JP)

(72) Inventor: Shigenobu Sekine, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 14/883,099

(22) Filed: Oct. 14, 2015

(51) Int. Cl.
*H01L 23/48* (2006.01)
*H01L 23/00* (2006.01)

(52) U.S. Cl.
CPC ..... *H01L 24/32* (2013.01); *H01L 2224/32235* (2013.01); *H01L 2924/3656* (2013.01)

(58) Field of Classification Search
CPC .............. H01L 23/10; H01L 23/3128; H01L 23/3677; H01L 24/11; H01L 24/32; H01L 24/23; H01L 24/29
USPC ......................................... 257/779
See application file for complete search history.

(56) References Cited

U.S. PATENT DOCUMENTS

| | | | | |
|---|---|---|---|---|
| 5,376,403 A * | 12/1994 | Capote | ................. | B22F 3/1035 148/24 |
| 5,948,533 A * | 9/1999 | Gallagher | .......... | B23K 35/0222 174/255 |
| 6,286,206 B1 * | 9/2001 | Li | ......................... | C22C 1/1036 156/283 |
| 7,259,465 B2 | 8/2007 | Soga et al. | | |
| 2003/0183306 A1 * | 10/2003 | Hehmann | ............... | C23C 14/14 148/404 |
| 2007/0295973 A1 * | 12/2007 | Jinbo | .................. | H01L 27/1214 257/88 |
| 2010/0075225 A1 * | 3/2010 | Wilkins | .............. | H01M 4/0404 429/212 |
| 2010/0301485 A1 * | 12/2010 | Sekine | ................... | H01B 3/025 257/769 |
| 2013/0136645 A1 | 5/2013 | Sekine et al. | | |

FOREIGN PATENT DOCUMENTS

| | | |
|---|---|---|
| JP | H01-176006 A | 7/1989 |
| JP | H01-198401 A | 8/1989 |
| JP | 2002-094242 A | 3/2002 |
| JP | 2002-261105 A | 9/2002 |
| JP | 2006228688 A | 8/2006 |
| JP | 3869859 B2 | 1/2007 |
| JP | 2007194669 A | 8/2007 |
| JP | 4563506 B1 | 10/2010 |
| JP | 2012-043822 A | 3/2012 |
| JP | 2013-115177 A | 6/2013 |
| WO | 98/39781 A1 | 9/1998 |

\* cited by examiner

*Primary Examiner* — Nitin Parekh
(74) *Attorney, Agent, or Firm* — Carrier Blackman & Associates, P.C.; Joseph P. Carrier; Anne G. Sabourin

(57) ABSTRACT

Provided is an electronic device which includes a conductor allowing an electric signal to transmit therethrough, the conductor containing a plurality of species of metal components having different melting points, and internally having a constituent concentration gradient produced as a result of diffusion of the metal components.

3 Claims, 11 Drawing Sheets

Fig. 4A
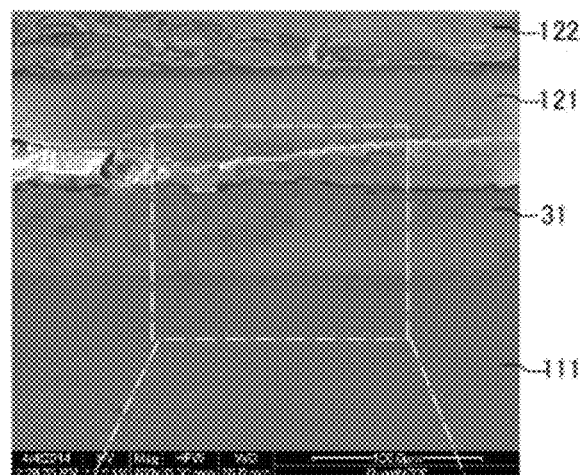
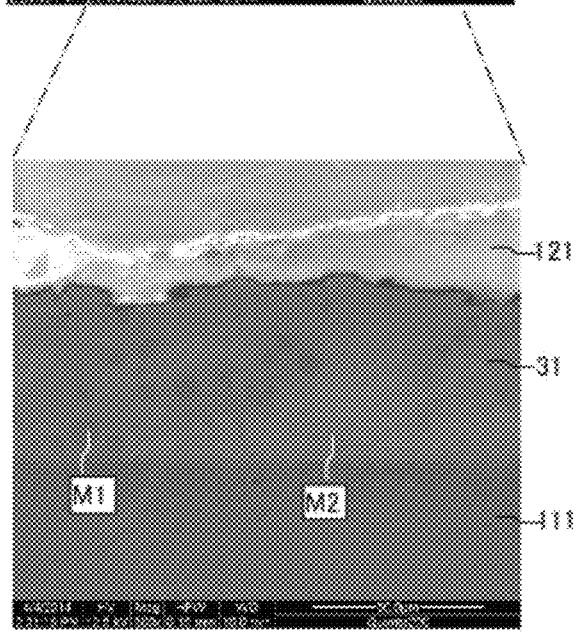
Fig. 4B

ELECTRONIC DEVICE, METHOD OF MANUFACTURING THE SAME, METAL PARTICLE, AND ELECTROCONDUCTIVE PASTE

BACKGROUND OF THE INVENTION

1. Field of the Invention

This invention relates to an electronic device, a method of manufacturing the same, and a metal particle and an electroconductive paste which are suitable for the method of manufacturing.

2. Description of the Related Art

In the field of electronic devices including integrated circuits of a variety of scales, various semiconductor elements or chips thereof, there has been proposed a technique of obtaining a three-dimensional circuit arrangement, called TSV (Through-Silicon-Via), by which a large number of through-conductors are preliminarily provided to each of circuit boards, the circuit boards are stacked and bonded. The three-dimensional circuit arrangement, applied with the TSV technique, will have a large number of functions integrated into a small occupation area. In addition, it also becomes possible to accelerate the processing speed, since principal electric interconnects among the elements can be dramatically shortened. Japanese Patent No. 3869859 discloses a viahole structure indispensable for the TSV technique.

The viahole structure disclosed in Japanese Patent No. 3869859 not only contains a refractory metal, a low-melting-point metal or alloy, and a crosslinking agent, but also indispensably contains a binder and/or reactive monomer or polymer. In the solidified state within the viahole, an alloyed metal network coexists with a polymer network produced by crosslinkage of an organic component in an electroconductive adhesive.

According to the description of Japanese Patent No. 3869859, in the solidified state within the viahole, since the polymer network coexists with the alloyed metal network, so that the electroconductivity is lowered to a corresponding degree.

Another known problem intrinsic to diffusion bonding of metal relates to degradation in mechanical strength due to Kirkendall void. The Kirkendall void generates when atomic vacancies (lattice defects), caused by unbalanced mutual diffusion, accumulate without disappearing. For an exemplary case of Sn/Cu interface, since Sn diffusion is inferior to Cu diffusion, so that vacancies accumulate at the boundary between intermetallic compound and Cu, to form the Kirkendall void. The Kirkendall void grows up to a larger void or crack to degrade reliability and quality of the bonded part and the conductor, and to further degrade the mechanical strength, which may even result in separation, disconnection or the like. Japanese Patent No. 3869859 discloses nothing about the countermeasures.

Next, JP-A-2002-261105 discloses a technique by which electrodes of a semiconductor device and electrodes on a mounting board are connected using connection parts having a $Cu_6Sn_5$-containing CuSn compound and Cu balls, and also the Cu balls are mutually connected again with the CuSn compound. It may however be anticipated that the Kirkendall void would be produced at the Sn/Cu boundary, so far as the electrode and electrode, and, the Cu ball and Cu ball are mutually connected with the CuSn compound.

A similar problem would occur when the connection parts, which mutually connect the semiconductor chips, are formed on the surface of a wafer, in electric interconnect making use of through-conductor, electric interconnect making use of planar conductor pattern, and in electronic devices in the form of three-dimensional system-in-package (3D-SiP).

SUMMARY OF THE INVENTION

It is therefore an object of this invention to provide an electronic device having a conductor which has a high bond strength, a high mechanical strength, and is less likely to cause separation, disconnection or the like; a method of manufacturing such electronic device; and a metal particle and an electroconductive paste suitable for the method of manufacturing the electronic device.

It is another object of this invention to provide a method of manufacturing an electronic device, allowing control of the solidifying point and fusion temperature after solidification; and a metal particle and an electroconductive paste suitable for the method of manufacturing the electronic device.

It is still another object of this invention to provide a method of manufacturing an electronic device, allowing diversified operations of bonding or formation of the conductor; and a metal particle and an electroconductive paste suitable for the method of manufacturing.

Aiming at solving the problems described above, this invention will disclose an electronic device, a method of manufacturing the same, and, a metal particle and an electroconductive paste suitable for the method of manufacturing. In this invention, the conductor may only be an article capable of allowing an electric signal to transmit therethrough, and includes electrode, interconnect, bump, bonding conductor and so forth. In this invention, "metal", "metal particle" or "metal component" refers not only to simple substance of metal element, but also to alloy which contains a plurality of metal elements, composite structure, or, combinations of them.

1. Electronic Device

The electronic device of this invention may encompass almost everything having an electronic circuit as its functional element, such as integrated circuit (IC), LSI of a variety of scales, MRAM (Magnetoresistive Random Access Memory), MEMS (Micro Electro Mechanical Systems), optical device, solar cell, EL display, liquid crystal display, plasma display, sensor module, optoelectric module, unipolar transistor, MOS FET, CMOS FET, and memory cell. The electronic device of this invention has a conductor allowing an electric signal to transmit therethrough, wherein the conductor contains a plurality of species of metal components having different melting points, and internally has a constituent concentration gradient produced as a result of diffusion of the metal components.

In the electronic device of this invention, since the conductor, allowing an electric signal to transmit therethrough, contains a plurality of species of metal components having different melting points as described above, so that it now becomes possible to form a conductor having a low fusion temperature but a high melting point after once solidified, depending on choice and combination of the metal components.

Moreover, the conductor internally has a constituent concentration gradient produced as a result of diffusion of the metal components. Occurrence of such constituent concentration gradient is a key point of this invention, and is discriminable from an ordinary diffusion according to which the metal particles remain intact only to show diffusion bonding among them.

Occurrence of the constituent concentration gradient, produced as a result of diffusion of the metal components within the conductor, means that a mutual diffusion bonding among the plurality of species of metal components gradually changes with physical distance. Accordingly, an obtainable electronic device will have a conductor which is exempt from accumulation of atomic vacancies (lattice defects) and growth of Kirkendall void, excellent in the reliability and quality, has a large mechanical strength, and is less likely to cause separation and disconnection.

The diffusion of the metal components also produces a nanocomposite structure within the conductor. The nanocomposite structure refers to a structure in which a nano-sized particulate matter or filmy matter is diffused in the crystal grain of one of the plurality of species of elements, or a nano-sized particulate matter or filmy matter is diffused in the grain boundary. In this invention, "nano" means sizes smaller than 1 μm.

Since the conductor contains the plurality of species of metal components having different melting points, so that a constituent concentration gradient produces in such a way that the content of the refractory metal component becomes maximum (100%) in a region occupied solely by the refractory metal component, that the content of the refractory metal component gradually reduces as the distance from the region occupied solely by the refractory metal component increases, and that the content of the low-melting-point metal component conversely increases. The constituent concentration gradient generates three-dimensionally from the entire circumference of the region solely occupied by the refractory metal component. Owing to the occurrence of such three-dimensional constituent concentration gradient, the Kirkendall void will be suppressed from growing three-dimensionally, and thereby the electronic device having a conductor characterized by a good reliability and quality, a large mechanical strength, and is less likely to cause separation or disconnection, will be obtained.

Size of the residual refractory metal particle and the constituent concentration gradient characteristic may be controlled based on the particle size, species and thermal history of the refractory metal particle to be used. Even if the species of the refractory metal component and the low-melting-point metal component were remained unchanged, the size of the refractory metal particle remained in the conductor, and the constituent concentration gradient characteristic may be controlled, by changing the heat treatment history. With such control, the operations of bonding or formation of the conductor may be diversified.

2. Method of Manufacturing Electronic Device

This is a method of manufacturing the electronic device according to this invention, which includes coating an electroconductive paste which contains a plurality of species of metal particles having different melting points dispersed into a vehicle, on a substrate used for supporting thereon the conductor; and then subjecting the electroconductive paste to heat treatment in plural times, to thereby control the constituent concentration gradient produced as a result of the metal particle.

The facts that the size of the residual refractory metal particle and the constituent concentration gradient may be controlled based on the size, species and heat treatment history of the refractory metal particle to be used; and that the size of the refractory metal particle remained in the conductor, and the constituent concentration gradient characteristic may be controlled by changing the heat treatment history, even if the species of the refractory metal component and the low-melting-point metal component were remained unchanged, are as described previously. According to the method of manufacturing of this invention, such control now makes it possible to diversify the operations of bonding or formation of the conductor.

3. Metal Particle

The metal particle of this invention contains a core part and an oxidation preventive film. The core part has a nanocomposite structure composed of metals or alloy, meanwhile the oxidation preventive film is composed of a hydride, and adheres to the outer surface of the core part to cover it.

As described previously, since in the metal particle of this invention, the oxidation preventive film adheres to the outer surface of the core part to cover it, so that the core part may be prevented from being oxidized. Since the oxidation preventive film is composed of a hydride, it now becomes possible to form an oxidation preventive film well suited to the alloy composing the core part, by virtue of diversity of the hydride.

The metal particle of this invention has a particle size of 10 μm or smaller, preferably 500 nm or smaller, and more preferably 200 nm or smaller. With such fine metal particles, a dense conductor may be formed.

4. Electroconductive Paste

The electroconductive paste of this invention contains a metal particle and a vehicle. In the electroconductive paste, the metal particle is the one according to this invention, and is dispersed in the vehicle.

Since, as described previously, the metal particle has the oxidation preventive film which is composed of the hydride and adheres to the outer surface of the core part to cover it, so that the metal particle is improved in the dispersibility in the vehicle.

Also since the metal particle of this invention has a particle size of 10 μm or smaller, preferably 500 nm or smaller, and more preferably 200 nm or smaller, so that the density of filling of the metal particle relative to the vehicle may be increased enough to form a dense conductor, and so that even a through-hole with a very small diameter may be filled successfully to form a through-electrode.

The above and other objects, configurations and advantages of this invention will further be detailed taken in conjunction with the accompanying drawings. Note that the accompanying drawings are merely for the purpose of exemplification.

BRIEF DESCRIPTION OF THE DRAWINGS

FIGS. 4A and 4B are SEM images of the conductor in the electronic device according to this invention.

DESCRIPTION OF THE PREFERRED EMBODIMENTS

1. Electronic Device

Figure 1:
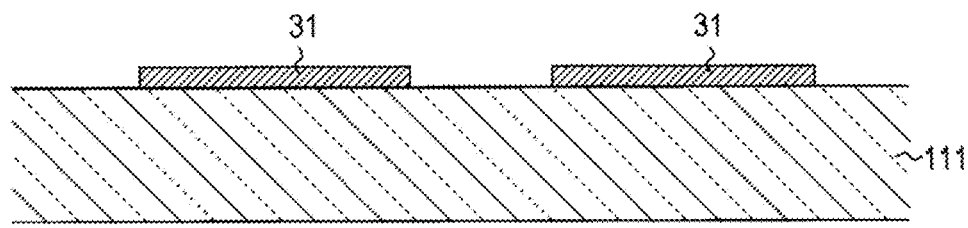
FIG. 1 is a drawing illustrating an exemplary electronic device according to this invention.

The electronic device of this invention has, as illustrated in FIG. 1, conductors 31 which allow an electric signal to transmit therethrough. The conductors 31 are formed on the surface of a substrate 111. The substrate 111 may be composed of a semiconductor substrate, organic insulating substrate, inorganic insulating substrate, electroconductive substrate with an insulating coverage, or, composite substrate or stacked substrate composed of them.

The conductors 31 may only be a substance which allows an electric signal to transmit therethrough, and includes electrode, interconnect, bump, bonding conductor and so forth. In the example illustrated in FIG. 1, the conductors 31 configure electrodes, interconnects or bumps.

Figure 2:
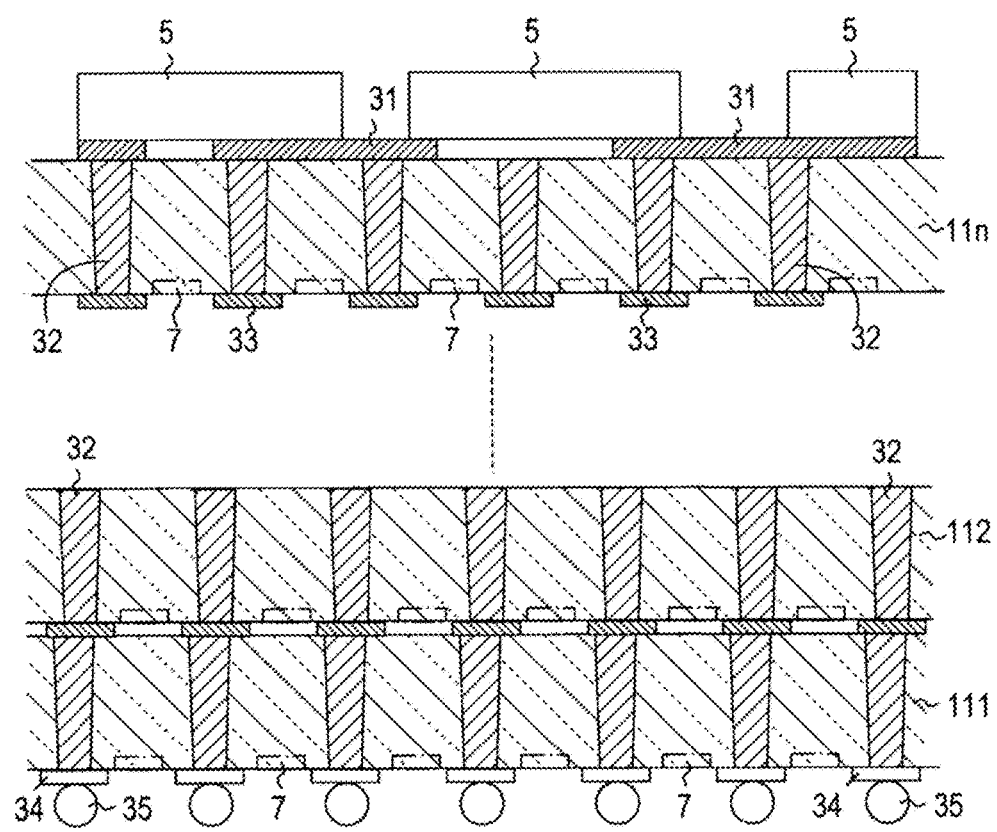
FIG. 2 is a drawing illustrating another example of the electronic device according to this invention.

FIG. 2 illustrates another embodiment of the electronic device according to this invention. In this embodiment, illustrated is a three-dimensional electronic device in which a plurality of (n) substrates 111 to 11n are stacked one after another, and conductors (through-electrode) 32 which respectively extend through the substrates 111 to 11n in the thickness direction are bonded via conductors 33 one after another.

On one surface of the topmost substrate 11n, there are provided the conductors 31 bonded to the end faces of the conductors 32, and on the conductors 31 a variety of electronic parts 5 are bonded. The conductor 31 configures the bumps or interconnects.

On the lower surface of the undermost substrate 111, conductors 34 which configure the bumps are formed. The conductors 34 are bonded on one surface thereof to the end faces of the conductors (through-electrodes) 32, and bonded on the other surface to solder balls 35.

The substrates 111 to 11n are configured by semiconductor substrates, having semiconductor circuit elements 7 formed inside thereof, and the conductors 31 to 35 are electrically connected to the semiconductor circuit elements 7. The substrates 111 to 11n may, however, be interposers having therein no semiconductor circuit element 7.

In the electronic device described above, at least one of the conductors 31 to 35, allowing an electric signal to transmit therethrough, contains a plurality of species of metal components having different melting points. In this embodiment, every one of the conductors 31 to 35 contains a plurality of species of metal components having different melting points. The metal component as used herein means simple substance of metal element, alloy which contains a plurality of metal elements, composite structure, or, combinations of them.

The plurality of species of metal components having different melting points, which compose the conductor 31, is selectable from the group consisting of Cu, Al, Ni, Sn, Ag, Au, Pt, Pd, Si, B, Ti, Bi, In, Sb, Ga and Zn.

In the electronic device described above, since the conductors 31 to 35 contain a plurality of species of metal components having different melting points, so that it now becomes possible to form a conductor having a low fusion temperature, but a high melting point after once solidified, depending on choice and combination of the metal components.

In addition, the conductors 31 to 35 have formed therein a constituent concentration gradient produced as a result of diffusion of the metal components. Occurrence of such constituent concentration gradient is a key point of this invention, and is discriminable from an ordinary diffusion according to which the metal particles remain intact only to show diffusion bonding among them. As a result of the diffusion described above, the conductor 31 has formed therein a nanocomposite structure.

Figure 3:
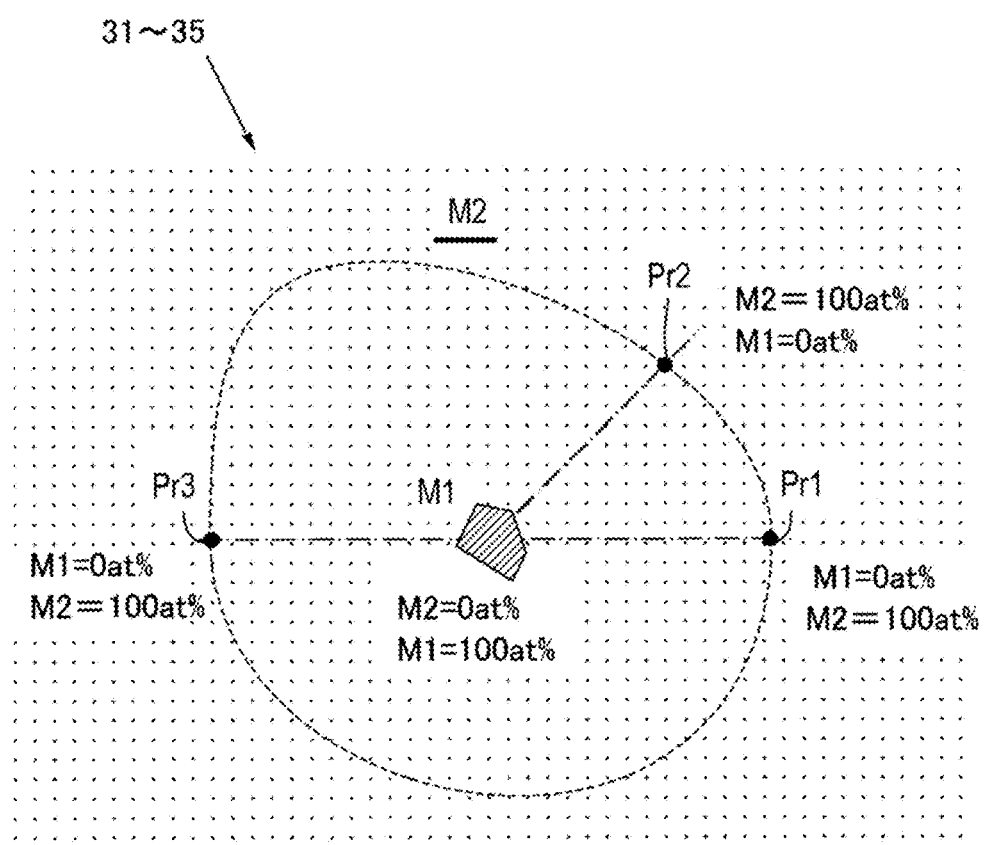
FIG. 3 is a drawing explaining a concept of constituent concentration gradient of the conductor in the electronic device according to this invention.

Referring now to FIG. 3, the conductors 31 to 35 contain a first metal component M1 and a second metal component M2, where the first metal component M1 has melting point T1, and the second metal component M2 has melting point T2 lower than the melting point T1 (T2<T1). Occurrence of the constituent concentration gradient in the conductors 31 to 35 under such conditions, as a result of diffusion of the first metal component M1 and the second metal component M2, means that mutual diffusion bonding of the first metal component M1 and the second metal component M2 gradually changes with physical distance. Accordingly, an obtainable electronic device will have a conductor which is exempt from accumulation of atomic vacancies (lattice defects) and growth of Kirkendall void, excellent in the reliability and quality, has a large mechanical strength, and is less likely to cause separation and disconnection.

In further detail referring to FIG. 3, in the region occupied by the first metal component M1 having the melting point T1, content of the first metal component M1 is 100 at %, whereas content of the second metal component M2 is minimized at 0 at %. The content of the first metal component M1 gradually decreases as the distance from the occupied region increases, and the content of the second metal component M2 conversely increases. The constituent concentration gradient is thus produced.

On the boundary where the first metal component M1 accounts for 0 at % and the second metal component M2 accounts for 100 at % (indicated by a dotted-line closed loop in FIG. 3), distances Pr1, Pr2 and Pr3 from the first metal component M1 often have different values.

The constituent concentration gradient generates three-dimensionally from the entire circumference of the region solely occupied by the first metal component M1 having the melting point T1. Owing to the occurrence of such three-dimensional constituent concentration gradient, the Kirkendall void will be suppressed from growing three-dimensionally, and thereby the electronic device having a conductor characterized by a good reliability and quality, a large mechanical strength, and is less likely to cause separation or disconnection, will be obtained.

The size of the refractory metal particle and the constituent concentration gradient characteristic may be controlled based on the species of refractory metal component, species of low-melting-point metal component, and heat treatment history. Moreover, even if the species of the refractory metal component and the low-melting-point metal component were remained unchanged, the size of the refractory metal particle and the constituent concentration gradient characteristic may be controlled, by changing the heat treatment history. With such control, the operations of bonding or formation of the conductor may be diversified.

Next, the constituent concentration gradient will further be detailed referring to SEM images. FIG. 4A is a SEM image of a sample obtained by forming the conductor 31 of this invention on the substrate (copper) 111, providing an observational polymer layer 121 over the conductor 31, and then bonding a hold glass plate 122 on the polymer layer 121. FIG. 4B is an enlarged view of the portion surrounded by a dotted-line rectangle shown in FIG. 4A. The conductor 31 has been obtained by coating, and then baking, an electroconductive paste which contains the first metal component M1 and the second metal component M2 dispersed in an organic vehicle, on the substrate 111. Cu particle was used as the first metal component M1, and Sn—Ag—Cu alloy particle was used as the second metal component M2. Baking conditions were 240° C. and 10 seconds.

Referring now to FIG. 4B, strongly dark particle-like portions spotted in the conductor 31 represent the first metal component M1, and brighter portions around them represent a constituent concentration gradient region produced as a result of diffusion of the metal components, and the second metal component M2.

Figure 5:
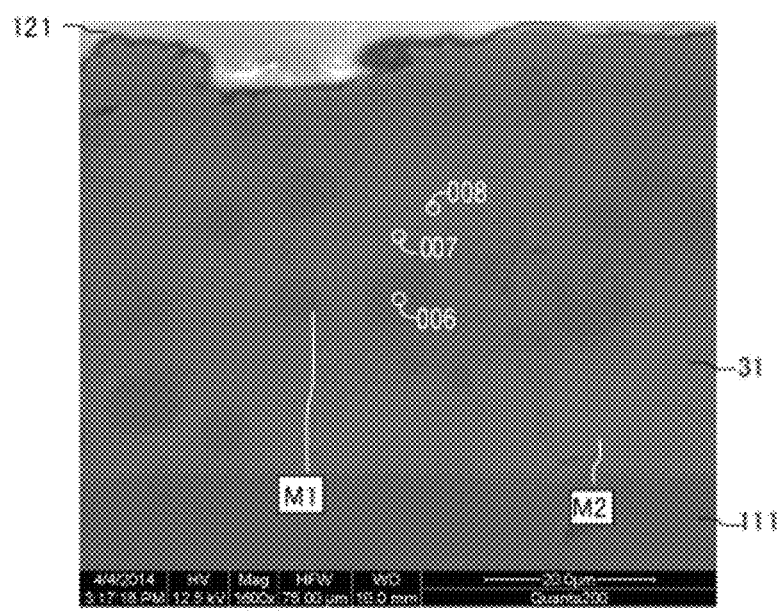
FIG. 5 is a drawing illustrating observation points 006, 007 and 008 set on the conductor illustrated in FIG. 4.
Figure 6:
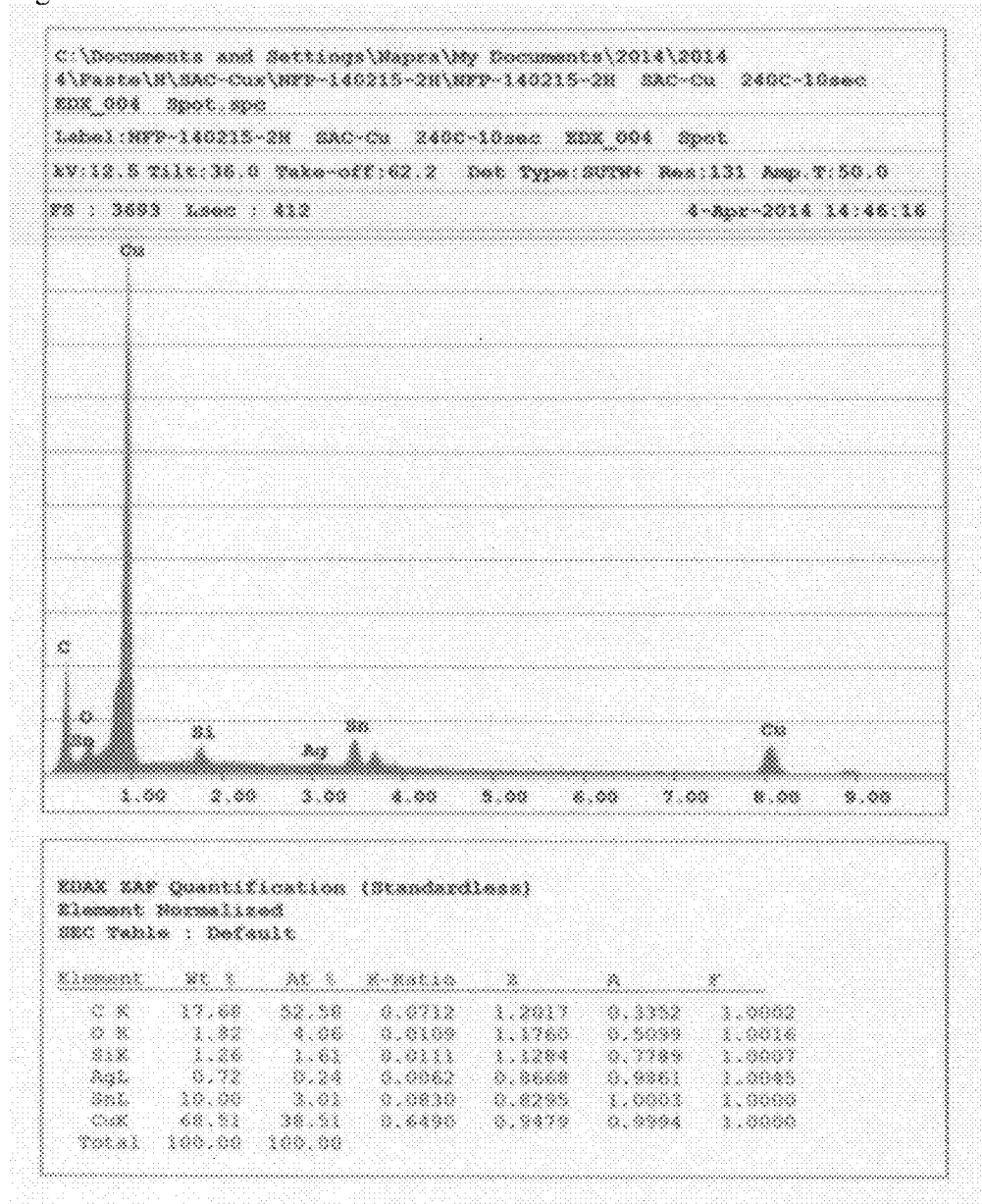
FIG. 6 is a drawing illustrating an EDX (energy-distributed X-ray spectroscopy) analytical result obtained at the observation point 006 in FIG. 5.
Figure 7:
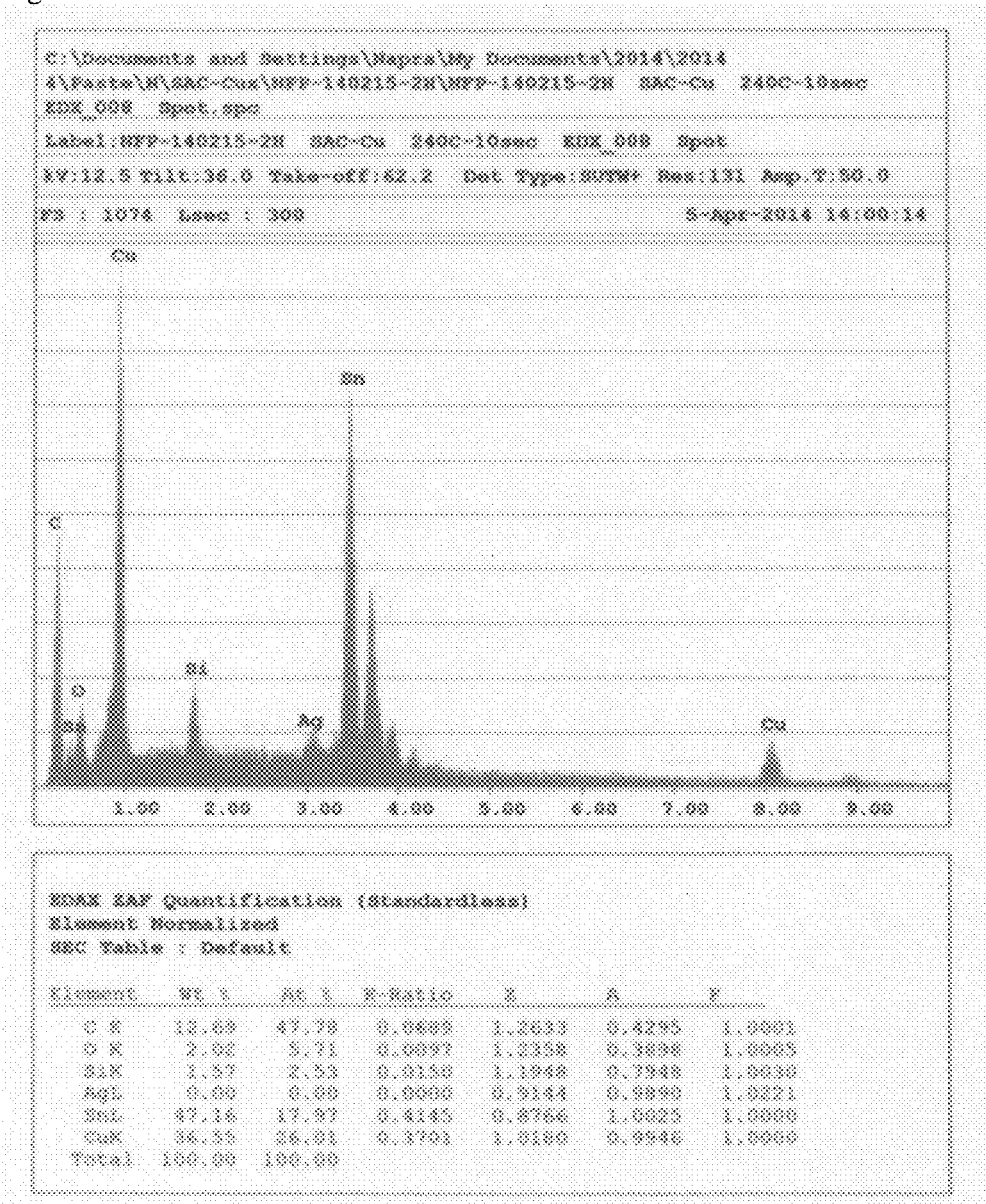
FIG. 7 is a drawing illustrating an EDX (energy-distributed X-ray spectroscopy) analytical result obtained at the observation point 007 in FIG. 5.
Figure 8:
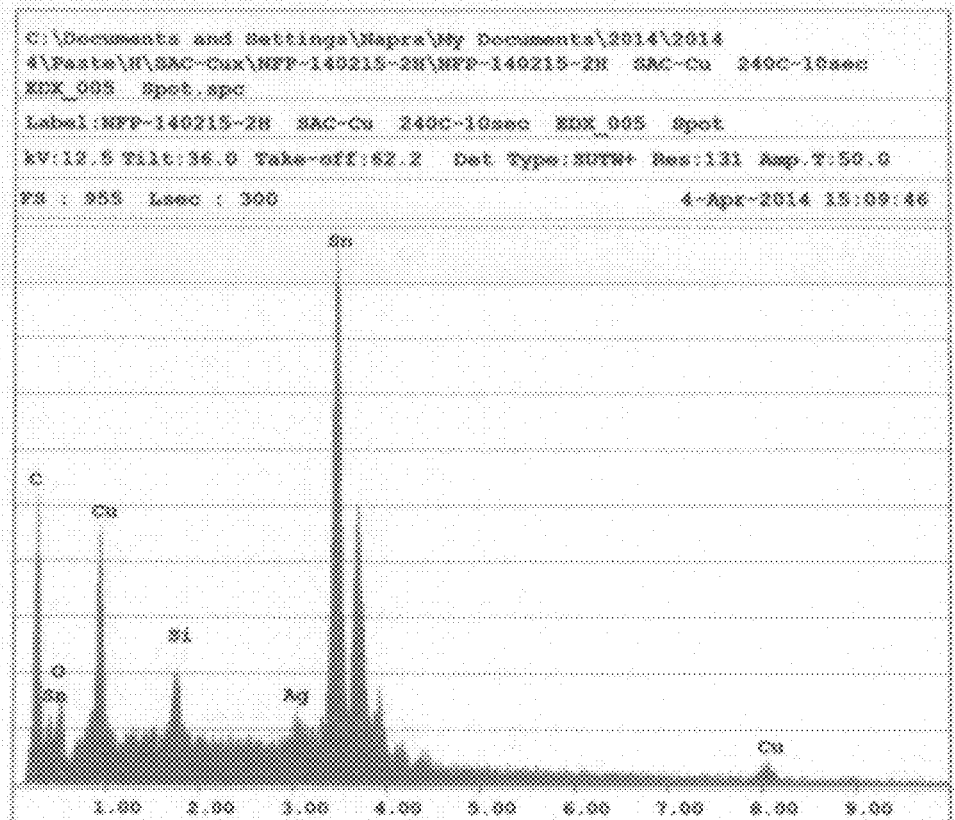
FIG. 8 is a drawing illustrating an EDX (energy-distributed X-ray spectroscopy) analytical result obtained at the observation point 008 in FIG. 5.

Referring next to FIG. 5, the observation points 006, 007 and 008 are set on the conductor. EDX (energy-dispersive X-ray spectroscopy) analytical results at the observation points 006, 007 and 008 are given in FIG. 6, FIG. 7 and FIG. 8, respectively. The observation point 006 is located in the region of the first metal component M1, the observation point 007 is located at a position 5 μm away from the first metal component M1, and the observation point 008 is located at a position 10 μm or more away from the metal component M1. At the observation point 006, as a matter of course, a strong peak assignable to Cu which composes the first metal component M1 is observed.

The observation point 007 located 5 μm away from the first metal component M1 composed of Cu showed a state of Cu diffusion, where the compositional ratio of Cu was found to decrease from 38.5 at % having been observed at the observation point 006, down to 26.01 at %, and conversely, the compositional ratio of Sn composing the second metal component M2 was found to increase from 3.01 at % having been observed at the observation point 006, up to 17.91 at %.

The observation point 008 located 10 μm away from the first metal component M1 composed of Cu showed a state of Cu diffusion, where the compositional ratio of Cu was found to decrease from 38.5 at % having been observed at the observation point 006, and from 26.01 at % having been observed at the observation point 007, down to 11.64 at %, and conversely, the compositional ratio of Sn composing the second metal component M2 was found to increase from 17.91 at % having been observed at the observation point 007, up to 28.00 at %.

Accordingly, it is clear that the constituent concentration gradient occurred in the conductor 31, as a result of diffusion of the first metal component M1 and the second metal component M2. As has been described previously, with such constituent concentration gradient, an obtainable electronic device will have a conductor which has a large bond strength and a large mechanical strength, and is less likely to cause separation and disconnection.

Figures 9A, 9B:
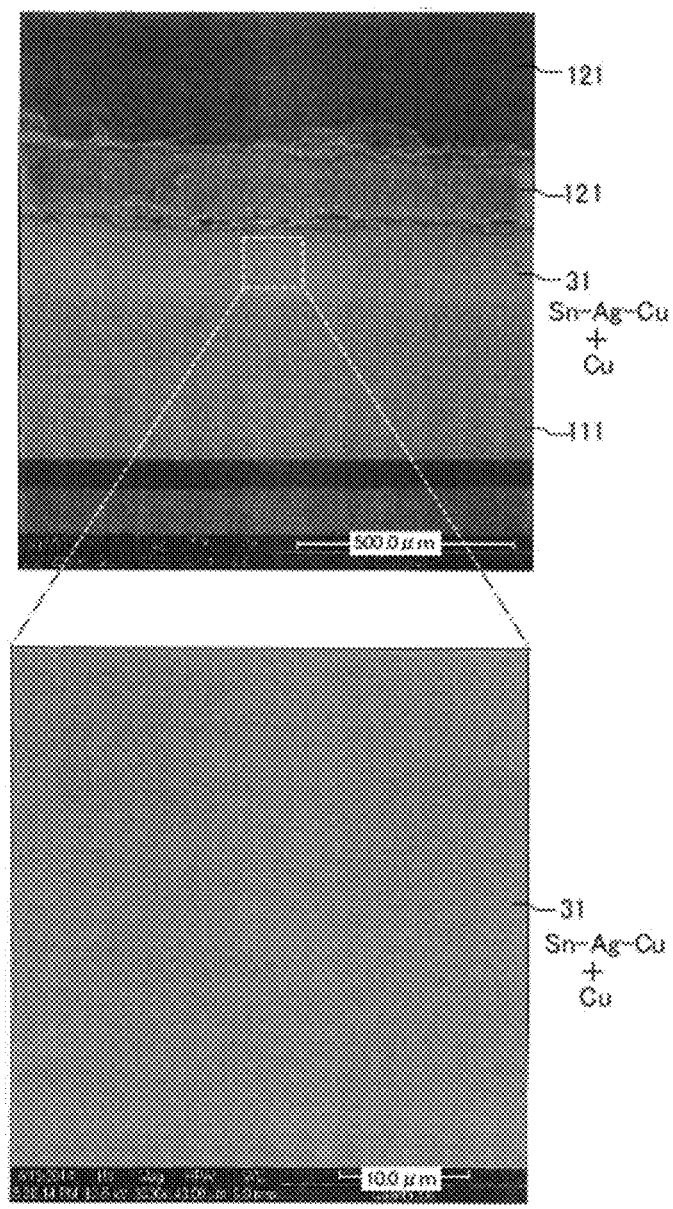
FIGS. 9A and 9B are SEM images of the conductor according to this invention.

Size of the residual refractory metal particle and the constituent concentration gradient characteristic may be controlled based on the particle size, species and thermal history of the refractory metal particle to be used, and thereby the operations of bonding or formation of the conductor may be diversified. This point will be explained more specifically referring to FIGS. 9A and 9B. FIG. 9A is a SEM image of a sample obtained by forming the conductor 31 on the substrate (copper) 111, providing the observational polymer layer 121 over the conductor 31, and then bonding a hold glass plate 122 on the polymer layer 121, which is similar to that having been illustrated in FIG. 4A. FIG. 9B is an enlarged view of the portion surrounded by a dotted-line rectangle shown in FIG. 9A.

Similarly to the case shown in FIGS. 4A and 4B, the conductor 31 is an article obtained by coating, and then baking, an electroconductive paste which contains the first metal component M1 and the second metal component M2 dispersed in an organic vehicle, on the substrate 111. Cu particle was used as the first metal component M1, and Sn—Ag—Cu alloy particle was used as the second metal component M2. Baking conditions were 240° C. and 10 seconds. What is different from FIGS. 4A and 4B is that the first metal component M1 used here was a Cu particle having an average particle size of 200 nm or smaller.

As is clear from comparison of FIGS. 9A, 9B with FIGS. 4A, 4B, the strongly dark particle-like first metal component M1 having been spotted in the conductor 31 as shown in FIGS. 4A, 4B was no more observable in FIGS. 9A, 9B, instead showing only a SEM image indicating that the conductor 31 has a homogeneous composition as a whole. This indicates that the Cu particle as the first metal component M1 and the Sn—Ag—Cu alloy component as the second metal component M2 mutually diffused, and thereby the particle geometry disappeared. As a result of such diffusion, the conductor 31 had formed therein a nanocomposite structure.

2. Method of Manufacturing Electronic Device

Figure 10A:
FIGS. 10A to 10D are drawings illustrating a method of manufacturing the electronic device according to this invention.

Although not specifically limited, the above-described electronic device may be manufactured, for example, according to a method illustrated in FIGS. 10A to 10D. Referring first to FIG. 10A, the substrate 111 for supporting thereon the conductor is prepared. The substrate 111 has provided thereto a large number of through-holes 320.

Figure 10B:
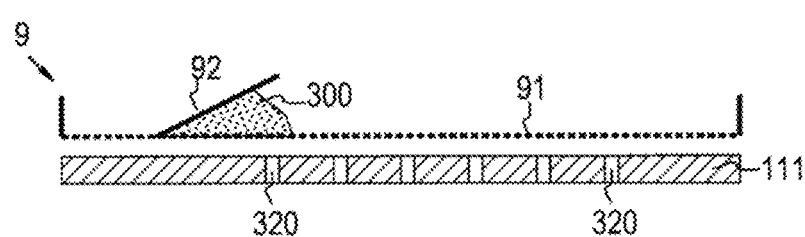
Figure 10C:
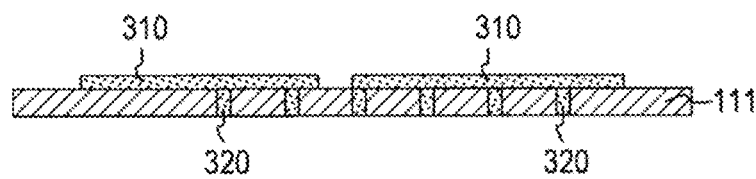
Figure 10D:
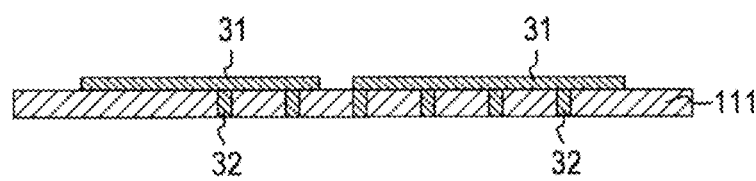

Next, as illustrated in FIGS. 10B and 10C, an electroconductive paste 300 which contains a plurality of species of metal particles having different melting points, dispersed in a vehicle, is coated on one surface of the substrate 111 using a coating device. In this embodiment, the coating device 9 is a screen printing device, with which the electroconductive paste 300 is fed to the substrate 111, by moving a squeegee 92 on a screen plate 91. In this embodiment, since the substrate 111 is provided with the through-holes 320, so that the electroconductive paste 300 not only remains to form the electroconductive paste 310 on the surface of the substrate 111, but is also filled in the through-holes 320. The coating device 9 is not limited to the screen printing device, but also may be devices for centrifugal filling, transfer printing and so forth.

Next, the electroconductive pastes 310, 320 are subjected to heat treatment in plural times, to thereby control the constituent concentration gradient produced as a result of diffusion of the metal particles.

The facts that the size of the refractory metal particle and the constituent concentration gradient may be controlled based on the species of refractory metal component, species of low-melting-point metal component, and heat treatment history; and that, even if the species of the refractory metal component and the low-melting-point metal component were remained unchanged, the size of the refractory metal particle and the constituent concentration gradient characteristic may be controlled by changing the heat treatment history, are as described previously.

Hence, according to the method of manufacturing according to this invention, and with such control, the operations of bonding or formation of the conductor may be diversified.

3. Metal Particle

Figure 11:
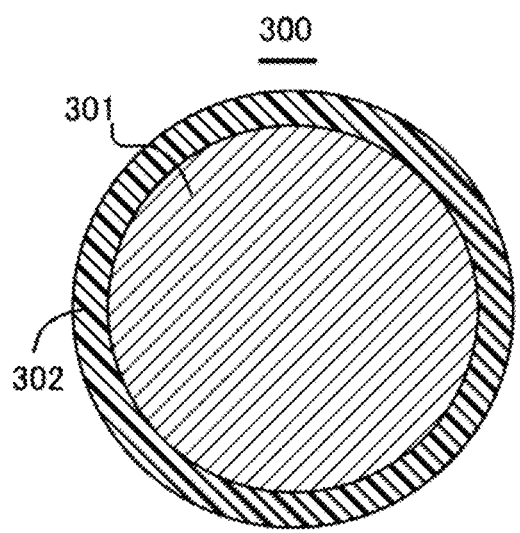
FIG. 11 is a drawing conceptually illustrating the metal particle according to this invention.

FIG. 11 is a drawing conceptually illustrating the metal particle according to this invention. As illustrated in FIG. 11, the metal particle 300 according to this invention contains a core part 301 and an oxidation preventive film 302. The core part 301 has a nanocomposite structure composed of metal or alloy, meanwhile the oxidation preventive film 302 is composed of a hydride, and adheres to the outer surface of the core part 301 to cover it. The nanocomposite structure means a structure such that a nano-sized particulate matter or filmy matter is dispersed in a crystal grain of one of the plurality of species of elements, or a nano-sized particulate matter or filmy matter is dispersed in a grain boundary. In this invention, "nano" means sizes smaller than 1 µm.

As described previously, in the metal particle 300 according to this invention, since the oxidation preventive film 302 adheres to the outer surface of the core part 301 to cover it, so that the core part 301 may be prevented from being oxidized. Since the oxidation preventive film 302 is composed of a hydride, it now becomes possible to form an oxidation preventive film well suited to the alloy composing the core part 301, by virtue of diversity of the hydride. The Hydride specifically contains at least one element selected from the group consisting of Sb, Bi, Si, Co, Pd, Pt, Au, Ti, Ni and Cr.

The metal particle according to this invention has a particle size of 10 µm or smaller, preferably 500 nm or smaller, and more preferably 200 nm or smaller. With such fine metal particles, a dense conductor may be formed. The metal particle may be either spherical or flattened.

4. Electroconductive Paste

The electroconductive paste according to this invention contains the metal particle illustrated in FIG. 11 and a vehicle. The metal particle is the one specified by this invention, and is dispersed in the vehicle. The vehicle is typically an organic vehicle, and is used in combination with an organic solvent.

As described previously, since the oxidation preventive film composed of a hydride adheres to the outer surface of the core part to cover it, so that the metal particle is improved in the dispersibility in the vehicle.

Moreover, since the metal particle according to this invention has a particle size of 10 µm or smaller, preferably 500 nm or smaller, and more preferably 200 nm or smaller, so that the density of filling of the metal particle relative to the vehicle may be increased enough to form the dense conductor, and so that even a through-hole with a very small diameter may be filled successfully to form a through-electrode.

As described previously, the effects below will be obtained according to this invention.

(a) It now becomes possible to provide an electronic device having a conductor, such as electrode, interconnect, bump, bonding conductor or the like, which has a high bond strength, a high mechanical strength, and is less likely to cause separation, disconnection or the like; a method of manufacturing such electronic device; and a metal particle and an electroconductive paste suitable for the method of manufacturing the electronic device.

(b) It now becomes possible to provide a method of manufacturing an electronic device, which allows control of the solidifying point and a fusion temperature after solidification; and a metal particle and an electroconductive paste suitable for the method of manufacturing the electronic device.

(c) It now becomes possible to provide a method of manufacturing an electronic device, allowing diversified operations of bonding or formation of the conductor; and a metal particle and an electroconductive paste suitable for the method of manufacturing.

This invention has been described in detail above with reference to, but not limited to, preferred embodiments. It is, however, obvious that those skilled in the art could devise various modifications of the invention based on the technical concepts underlying the invention and teachings disclosed herein.

What is claimed is:

1. An electronic device comprising a conductor including a through-substrate-electrode allowing an electric signal to transmit therethrough, the conductor containing a plurality of species of metal components comprising at least a first metal component and a second metal component, said first and second metal components having different melting points, and having a metal constituent concentration gradient produced as a result of heating and subsequent diffusion of the first metal component and the second metal component when subjected to heat treatment under predetermined thermal conditions, said concentration gradient, measured as at. % of the first metal component, generating three-dimensionally from an entire circumference of a through-hole of the through-substrate-electrode towards a center thereof, as seen in a cross-sectional view, the metal components being selected from metal elements, metal alloys and composite structures which contain a plurality of metal elements, and combinations thereof, a nanocomposite structure formed due to the diffusion of the first and second metal components, the nanocomposite structure being such that:

(a) in a crystal grain of one of the metal components, a nano-sized particulate matter the other metal component resides; or, (b) in a grain boundary of one of the metal components, a nano-sized particulate matter of the other metal component resides, wherein the first and second metal components comprise metal particles composed of a core part having a core surface, and adhered to the core surface is an oxidation preventative film of a hydride to cover said core surface.

2. The electronic device according to claim 1, wherein one of the first and second metal components is a refractory metal component and the other metal component has a lower melting point than that of the refractory metal component.

3. An electronic device comprising a conductor including a through-substrate-electrode allowing an electric signal to transmit therethrough, the conductor containing a plurality of species of metal components comprising at least a first metal component and a second metal component, said first and second metal components having different melting points, said first and second metal components having a metal constituent concentration gradient produced as a result of heating and subsequent diffusion of the first metal component and the second metal component when subjected to a heat treatment under predetermined thermal conditions, said concentration gradient measured as at. % of the first metal component generating three-dimensionally from an entire circumference of a through-hole of the through-substrate-electrode towards a center thereof, as seen in a cross-sectional view, the first and second metal components being selected from a metal element, an alloy and a composite structure which contain a plurality of metal elements, and combinations thereof, a nanocomposite structure formed due to the diffusion of the first and second metal components, the nanocomposite structure being such that:

(a) in a crystal grain of one of the first and second metal components, nano-sized particulate matter of the other metal component resides; or, (b) in a grain boundary of one of the metal components, nano-sized particulate matter of the other metal component resides, and wherein the first and second metal components comprise particles having a particle size of 500 nm or less and said particles are composed of a core part having a core surface, and adhered to the core surface is an oxidation preventative film of a hydride to cover said core surface.

* * * * *